US012189009B2

(12) United States Patent
Zeller et al.

(10) Patent No.: US 12,189,009 B2
(45) Date of Patent: Jan. 7, 2025

(54) DETERMINING TEST POSITIONS IN A TARGET VOLUME FOR A MAGNETIC RESONANCE SYSTEM TEST MEASUREMENT TO IMPROVE MAGNETIC RESONANCE IMAGE QUALITY OF THE SYSTEM

(71) Applicant: Siemens Healthineers AG, Forccheim (DE)

(72) Inventors: Mario Zeller, Erlangen (DE); Adam Kettinger, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 151 days.

(21) Appl. No.: 17/955,784

(22) Filed: Sep. 29, 2022

(65) Prior Publication Data
US 2023/0101028 A1 Mar. 30, 2023

(30) Foreign Application Priority Data
Sep. 29, 2021 (EP) .................................... 21199777

(51) Int. Cl.
*G01R 33/54* (2006.01)
(52) U.S. Cl.
CPC .................... *G01R 33/54* (2013.01)
(58) Field of Classification Search
CPC .. G01R 33/54; G01R 33/543; G01R 33/5611; G01R 33/565; G01R 33/56518; G01R 33/56572
See application file for complete search history.

(56) References Cited

U.S. PATENT DOCUMENTS 8,085,043 B2 * 12/2011 Grimme ............. G01R 33/4833
324/309
8,861,819 B2 * 10/2014 Lee ........................... G06T 5/50
382/128

(Continued)

FOREIGN PATENT DOCUMENTS

DE 102019204151 A1 10/2020

OTHER PUBLICATIONS

Breuer, Felix A. et al.: "Controlled Aliasing in Parallel Imaging Results in Higher Acceleration (CAIPIRINHA) for Multi-Slice Imaging"; in: Magnetic Resonance in Medicine 53: S. 684-691; 2005.

(Continued)

*Primary Examiner* — Jay Patidar
(74) *Attorney, Agent, or Firm* — Banner & Witcoff Ltd.

(57) ABSTRACT

In a method for determining at least one test position for a test measurement to be recorded by means of a magnetic resonance system, a test image is recorded, and at least one test position is selected based on the test image. With methods for the compensation of effects of deviations of gradients actually generated during a readout duration from gradients planned for this readout time duration, the selection of test positions according to the disclosure based on a test image advantageously ensures that the test positions lie in a recording region favorable for the test measurement, e.g. also within an examination object to be examined in the test image. A higher image quality in MR images, which were generated using test measurements carried out at test positions positioned according to the disclosure, can therefore be achieved.

19 Claims, 4 Drawing Sheets

(56) References Cited

U.S. PATENT DOCUMENTS

| | | | |
|---|---|---|---|
| 8,981,776 B2 | 3/2015 | Setsompop et al. | |
| 2012/0268124 A1* | 10/2012 | Herbst | G01R 33/56509 324/309 |
| 2013/0154639 A1 | 6/2013 | Oh et al. | |
| 2016/0154075 A1* | 6/2016 | Song | G01R 33/3621 324/322 |
| 2020/0309881 A1 | 10/2020 | Grodzki | |
| 2022/0026513 A1* | 1/2022 | Kettinger | G01R 33/4826 |

OTHER PUBLICATIONS

Gagoski, Borjan A. et al. "RARE/Turbo Spin Echo Imaging with Simultaneous Multislice Wave-CAIPI" Magnetic Resonance in Medicine; vol. 73; pp. 929-938; 2015 // DOI: 10.1002/mrm.2561.

Setsompop, Kawin et al. "Blipped-Controlled Aliasing in Parallel Imaging for Simultaneous Multislice Echo Planar Imaging With Reduced g-Factor Penalty," Magnetic Resonance in Medicine; vol. 67; No. 5; pp. 1210-1224; 2012 // DOI 10.1002/mrm.23097.

Bilgic, Berkin et al. "Wave-CAIPI for Highly Accelerated 3D Imaging" Magnetic Resonance in Medicine, vol. 73, No. 6, pp. 2152-2162, 2015 // DOI: 10.1002/mrm.25347.

Cauley Stephen F. et.al.; "Autocalibrated Wave-CAIPI Reconstruction, Joint Optimization of k-Space Trajectory and Parallel Imaging Reconstruction"; International Society for Magnetic Resonance in Medicine; 2016.

Polak, D. et al., "Highly-Accelerated Volumetric Brain Examination Using Optimized Wave-CAIPI Encoding," J. Magn. Reson. Imaging, vol. 50, No. 3, pp. 961-974; 2019.

Chen et al. "Self-Calibrating Wave-Encoded Variable-Density Single-Shot Fast Spin Echo Imaging," J. Magn. Reson. Imaging; 2018; 47:954-966.

Anonym: "Phantom Test Guidance for Use of the Large MRI Phantom for the MRI Accreditation Program 2"; pp. 1-28; 2018; XP055892745; https://www.acraccreditation.org/-/media/acraccreditation/documents/mri/largephantomguidance.pdf.

* cited by examiner

DETERMINING TEST POSITIONS IN A TARGET VOLUME FOR A MAGNETIC RESONANCE SYSTEM TEST MEASUREMENT TO IMPROVE MAGNETIC RESONANCE IMAGE QUALITY OF THE SYSTEM

CROSS REFERENCE TO RELATED APPLICATIONS

This patent application claims priority to European Patent Application No. 21199777.0, filed Sep. 29, 2021, which is incorporated herein by reference in its entirety.

BACKGROUND

Field

The disclosure relates to a method for determining a PSF for a reconstruction of image data from measurement data recorded by means of a magnetic resonance system.

Related Art

Magnetic resonance technology (the abbreviation MR is used below for magnetic resonance) is a known technology, which can be used to generate images of the inside of an examination object. In simple terms, this is done by placing the examination object in a magnetic resonance device in a comparatively strong static, homogeneous main magnetic field, also called the $B_0$ field, at field strengths of 0.2 tesla to 7 tesla and higher, with the result that the nuclear spins of the object are oriented along the main magnetic field. In order to trigger nuclear spin resonances that are measurable as signals, radio-frequency excitation pulses (RF pulses) are radiated into the examination object and the nuclear spin resonances produced are measured as so-called k-space data and, on the basis thereof, MR images are reconstructed or spectroscopic data is determined. For position encoding of the measurement data, rapidly switched magnetic gradient fields, known as "gradients" for short, are overlaid on the main magnetic field. A pattern that is used which defines a temporal sequence of RF pulses to be radiated in and gradients to be switched is known as a pulse sequence (scheme) or "sequence" for short. The recorded measurement data is digitized and stored as complex number values in a k-space matrix. From the k-space matrix occupied with values, an associated MR image is reconstructable, for example by means of a multi-dimensional Fourier transform.

So-called parallel acquisition (PPA) techniques such as GRAPPA (GeneRalized Autocalibrating Partially Parallel Acquisition) or SENSE (Sensitivity Encoding) can also be used, in which, with the aid of a plurality of RF coils, only a number of measurement data items undersampled in the k-space according to the Nyquist theorem are acquired, in order, for example, to shorten the measurement time necessary overall for the acquisition of the measurement data or to increase the resolution. The "missing" measurement data that is not measured, but is needed for a complete set of measurement data in accordance with the Nyquist theorem, is hereby enhanced on the basis of sensitivity data of the RF coils used and calibration data and the measured measurement data.

The desire for ever faster MR acquisitions in the clinical environment is leading, at the same time, to a resurgence of methods in which a plurality of images are acquired simultaneously. In general, these methods can be characterized in that at least during a part of the measurement, targeted transverse magnetization of at least two slices is used simultaneously for the imaging process (multi-slice imaging, slice multiplexing or simultaneous multi-slice (SMS)). In contrast thereto, in the established "multi-slice imaging", the signal is acquired from at least two slices alternatingly, i.e. completely independently of one another with correspondingly longer scan times.

Known SMS methods are, for example, methods which use methods from the aforementioned imaging by means of PPA in which knowledge regarding the sensitivity distribution of the receiving coils used during the acquisition of the measurement data is utilized as additional information in order to fill up undersampled measurement data according to the Nyquist method in the slice direction, in order to separate signals recorded overlaid from a plurality of slices into signals of the individual slices. These methods include, for example, the CAIPIRINHA technique as described by Breuer et al. in "Controlled Aliasing in Parallel Imaging Results in Higher Acceleration (CAIPIRINHA) for Multi-Slice Imaging", in Magnetic Resonance in Medicine 53, 2005, pp. 684-691 and the blipped CAIPIRINHA technique as described by Setsompop et al. in "Blipped-Controlled Aliasing in Parallel Imaging for Simultaneous Multi-slice Echo Planar Imaging With Reduced g-Factor Penalty", in Magnetic Resonance in Medicine 67, 2012, pp. 1210-1224, wherein the g-factor (geometry factor) mentioned in the latter publication is a measure for a separability of the different receiving coils used.

As a method for further reducing this g-factor, it is also known for the CAIPIRINHA method to alter the readout trajectories in the k-space and thereby to alter the acquisition scheme so that the measurement data is captured along readout trajectories that proceed in a wave shape or a helical shape. This is described for instance in U.S. Pat. No. 8,981,776B2, in the article by Bilgic et al. "Wave-CAIPI for Highly Accelerated 3D Imaging", Magnetic Resonance in Medicine 73:2152-2162 (2015), or, for two-dimensional (2D) imaging in Chen et al. "Self-Calibrating Wave-Encoded Variable-Density Single-Shot Fast Spin Echo Imaging", J. Magn. Reson. Imaging 2018, 47:954-966, or also for Spin echo (SE) methods in Gagoski et al. "RARE/Turbo Spin Echo Imaging with Simultaneous Multislice Wave-CAIPI", Magn. Reson. Med. 73:929-938 (2015).

In short, for such wave techniques during the readout process, simultaneously with a gradient in the readout direction, at least one sinus-shaped modulated gradient is played out in a direction oriented perpendicularly to the readout direction. A wave-shaped or screw-shaped k-space trajectory obtained in this way distributes artifacts, for example aliasing artifacts such as occur due to an undersampling of the k-space applied for shortening the scan time, in at least two or, for screw-shaped k-space trajectories, in all spatial directions and also enables sensitivity data of the RF coils used to be employed in a plurality of (all three) spatial directions, which leads to the aforementioned reduction of the g-factor.

Thus, with wave techniques, for example higher accelerations, and therefore a stronger undersampling can be used with constant quality of the image data obtained as compared with "non-wave PPA techniques" with lower acceleration.

The effect of the modulated gradients, also known as wave gradients, on a magnetization m at a spatial point wave (x, y, z) can be described as a multiplication by a "point-spread function" PSF, which defines the spread of aliasing artifacts of undersampling schemes:

$$\text{Wave}(x,y,z) = F^{-1}_x \text{PSF}(k_x,y,z) F_x m(x,y,z),$$

where $F_x$ stands for a Fourier transform and $F^{-1}_x$ is the inverse Fourier transform and $\text{PSF}(k_x,y,z)$ stands for the PSF for a wave gradient represented in the hybrid $k_x$-y-z-space. The PSF describes the effect of the modulated gradients on the imaging phase in the $k_x$-direction and can be respectively separated into terms dependent upon y and z. As in the aforementioned article by Bilgic et al., aliasing artifacts can therefore be remedied through "unaliasing" by means of a SENSE reconstruction. This is described for example more precisely in the article by Polak et al. "Highly-Accelerated Volumetric Brain Examination Using Optimized Wave-CAIPI Encoding", J. Magn. Reson. Imaging 2019 50:961-974.

Ideally, the PSFs of sinusoidally or cosinusoidally modulated gradients are also sinusoidal or cosinusoidal.

Therefore, a modulation transfer function MTF obtained through a Fourier transform of such a PSF should have only a frequency component. In reality, however, a spectrum of a real PSF described by an MTF is typically broadened by imperfections of the gradients used during the readout process, which can be caused, for example, by eddy currents and delays in the gradients switched, etc. Therefore, a reconstruction of image data which uses an ideal PSF leads to a blurring in the reconstructed image data.

Thus, wave techniques prove to be particularly sensitive to imperfections in the gradients used during the readout process, so that deviations in the gradients actually generated during a measurement lead, during a readout duration, from the respective ideal gradients planned for this readout duration, to artifacts in the image data that is ultimately obtained.

However, such deviations of gradients actually generated during a measurement during a readout duration from the respectively planned gradients for this readout duration often occur, for example, because of high currents in the respective gradient coils and effects caused thereby such as eddy currents, higher order fields, etc.

Attempts are being made to reduce the negative effects of the aforementioned deviations by observation of known, static, constant time delays of the respective gradient coils retrospectively during the reconstruction. However, this procedure leaves frequency-dependent components of the delays in the switched gradients and deviations caused thereby as well as any deviations of the magnitudes achieved in the switched gradients from the planned gradients out of consideration, so that by means of this inflexible approach, only a possibly inadequate remedying of artifacts can be achieved.

Furthermore, for example in the article by Cauley et al. "Autocalibrated Wave-CAIPI Reconstruction; Joint Optimization of k-Space Trajectory and Parallel Imaging Reconstruction", Magnetic Resonance in Medicine 78, 2017, pp. 1093-1099, an iterative method has been described which varies frequency parameters of the point spread function (PSF) which describes the spread of aliasing artifacts from undersampling schemes and which compares reconstruction results obtained at selected test positions with the different frequency parameters over their root mean square error (RMSE). If the RMSE approaches a local minimum, the associated value of the frequency parameter is adopted as that of the PSF being sought. On the basis of the PSF found, a correction of the deviation of the gradients for wave k-space trajectories is described. However, one disadvantage of this method is a possibly long period of time which is required to find the PSF being sought.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

The object underlying the disclosure is to improve methods which use test measurements on test positions of an examination object.

An inventive method for determining at least one test position for a test measurement to be recorded by means of a magnetic resonance system may include the following operations:
  recording a test image,
  selecting at least one test position on the basis of the test image.

The knowledge underlying the disclosure is that with applications which require data of test measurements of a magnetic resonance system, an achievable result depends on the quality of the test positions selected for the test measurements in the target volume of the measurement.

In particular for methods for the compensation of effects of deviations of gradients actually generated during a readout duration from the gradients planned for this readout duration, e.g. for a PSF determination such as is described in the afore-cited article by Cauley et al., by inventively selecting test positions on the basis of a test image, it is possible to ensure that the test positions lie in a recording region which is favorable to the test measurement, e.g. also within an examination object to be examined in the test image.

A higher image quality in MR images, which were generated using test measurements carried out at test positions positioned according to the disclosure, can therefore be achieved.

A magnetic resonance system according to the disclosure comprises a magnet unit, a gradient unit, a radio-frequency unit and a controller designed for carrying out a method according to the disclosure with a test position determining unit.

A computer program according to the disclosure implements a method according to the disclosure on a controller, when it is executed on the controller.

The computer program can herein also be present in the form of a computer program product which can be directly loaded into a memory store of a controller, having program code means in order to carry out a method according to the disclosure when the computer program product is executed in the computer unit of the computer system.

An electronically readable data carrier according to the disclosure comprises electronically readable control information stored thereon, which comprises at least one computer program according to the disclosure and may be configured such that, when the data carrier is used in a controller of a magnetic resonance system, it carries out a method according to the disclosure.

The advantages and details set out in relation to the method also apply accordingly for the magnetic resonance system, the computer program product and the electronically readable data carrier.

Figure 1:
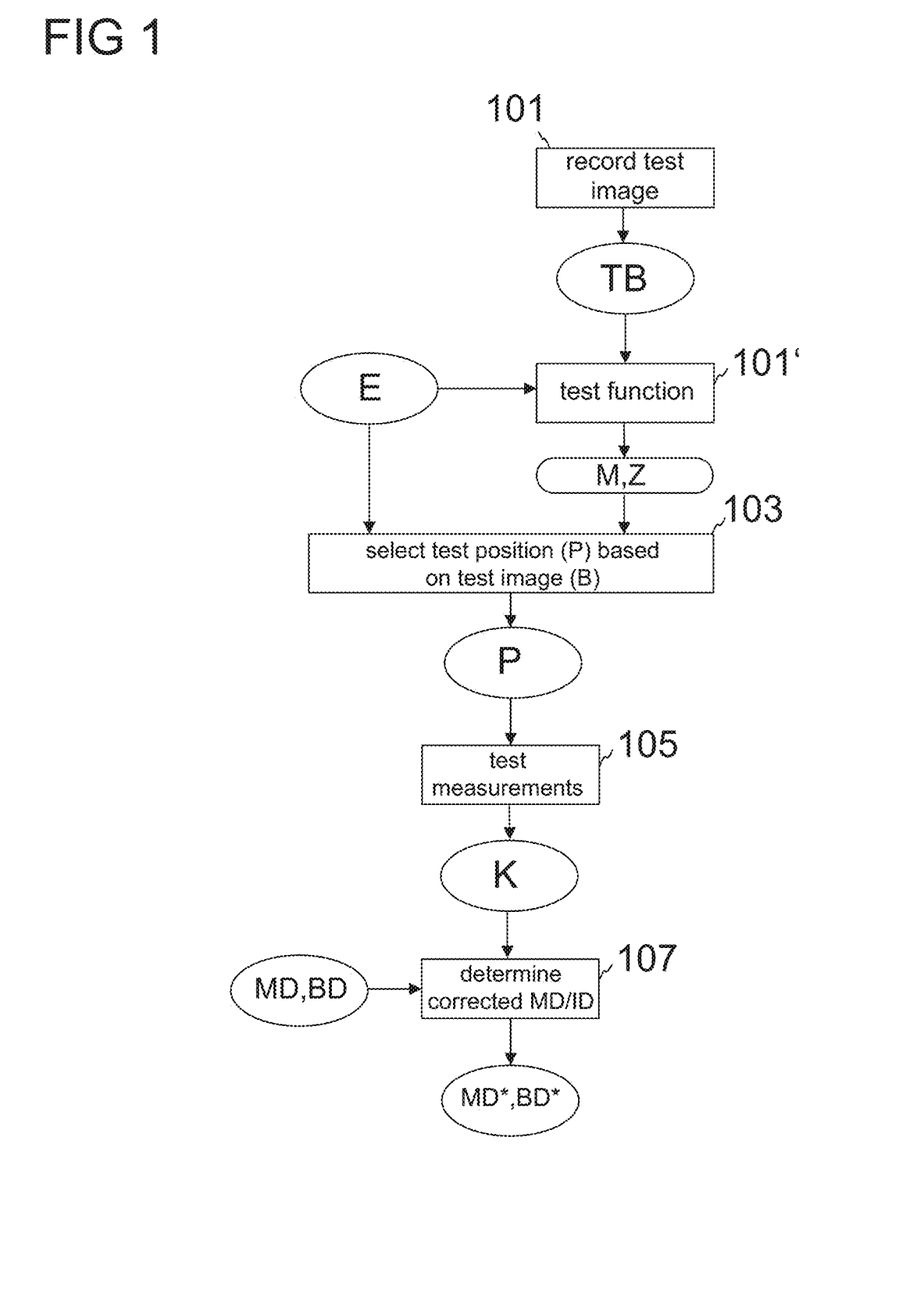
FIG. 1 shows a schematic flow diagram of a method according to an exemplary embodiment of the present disclosure.

FIG. 1 shows a schematic flow diagram of a method according to the disclosure for determining at least one test position for a test measurement to be recorded by means of a magnetic resonance system.

A test image B may be recorded in the process (Block 101).

The test image B can be a test image B reconstructed from data, in particular calibration data, recorded within the scope of a pre-scan. Calibration data may be frequently recorded in conjunction with MR measurements, e.g. in order to adjust measurement parameters and/or to determine coil sensitivity data, and generally has a lower resolution than measurement data recorded for diagnostic MR images. It is therefore quick to calculate and requires less storage space. It is also possible, however, for the test image B to be an MR image reconstructed from measurement data recorded for a desired examination of an examination object.

At least one test position P may be selected on the basis of the test image B (Block 103).

Different procedures are conceivable here. Examples of this are described on the basis of FIGS. 2 to 5.

The at least one test position can be selected on the basis of a first predetermined test grid, which defines a number of test positions and their distribution pattern in a displayed target region of the test image B. The test grid can be e.g. a Cartesian test grid or a hexagonal test grid. The test grid can be fixedly predetermined. It is also possible to define the test grid by means of a user input E.

An assignment function M can be determined on the basis of the test image B, said assignment function assigning test positions to permitted test positions (e.g. in favorable regions A2 of the test image) or blocked test positions (e.g. in unfavorable regions of the test image B) (Block 101').

The assignment function M can be based on intensity values of the test image B and consider a minimal intensity value, for instance. Regions of the test image B which reach the minimal intensity value can be characterized as favorable for a positioning of a test position, and regions of the test image B which do not reach the minimal intensity value can be characterized as unfavorable for a positioning of a test position. A minimal intensity value can be fixedly predetermined or determined by a user input E.

For instance, the assignment function M can be determined in the form of a binary mask, which blocks test positions which lie in a region A1 of the test image B, in which a minimally required intensity value is not reached, and which permits test positions which lie in a region A2 of the test image B, in which a minimally required intensity value is reached.

In this way, negative effects of test positions lying in unfavorable, in particular low-intensity and thus noisy regions of the test image can be avoided since such test positions are blocked. For instance, with a determination of PSFs at test positions for an improved reconstruction of measurement data recorded by means of a wave technique, such as described for instance in the already cited article by Cauley et al., the required computing time is simultaneously reduced in this way, since fewer test positions are permitted.

The selection of test positions can also comprise a weighting of test positions according to a weighting factor depending on an intensity value of the test image at a respective, in particular a permitted, test position. Here the weighting factor of a test position can depend directly proportionally on the intensity value present at the test position in the test image. It is however also conceivable to select weighting factors in a graded manner. For instance, for all test positions which have an intensity value in the test image which is greater than or equal to a specific required intensity value of the test image B, e.g. to a specific required intensity value according to the average value or also mean as an average intensity value, the weighting factor can be set to the value one. For all test positions which have an intensity value in the test image which is less than or equal to a specific minimal intensity value of the test image B, e.g. to an intensity value of at most 5% of the average intensity value of the test image B, the weighting factor can be set to the value zero. For test positions with an intensity value in the test image B, which is between the required intensity value and the minimal intensity value, the weighting factor can be set continuously from the value one to the value zero, for instance in a linear or cubic manner or according to a (square) root function. A weighting with the weighting factor zero corresponds here to a blockage of the test position.

A weighting of this type can be easily realized for instance in an assignment function M, in particular in the form of a weighted mask.

By means of a weighting of this type, it is possible to achieve that fewer test positions are blocked, wherein the influence of test positions positioned in more unfavorable regions of the test image B is nevertheless reduced.

The use of more test positions can have a stabilizing effect (e.g. by way of averaging effects).

Figure 2:
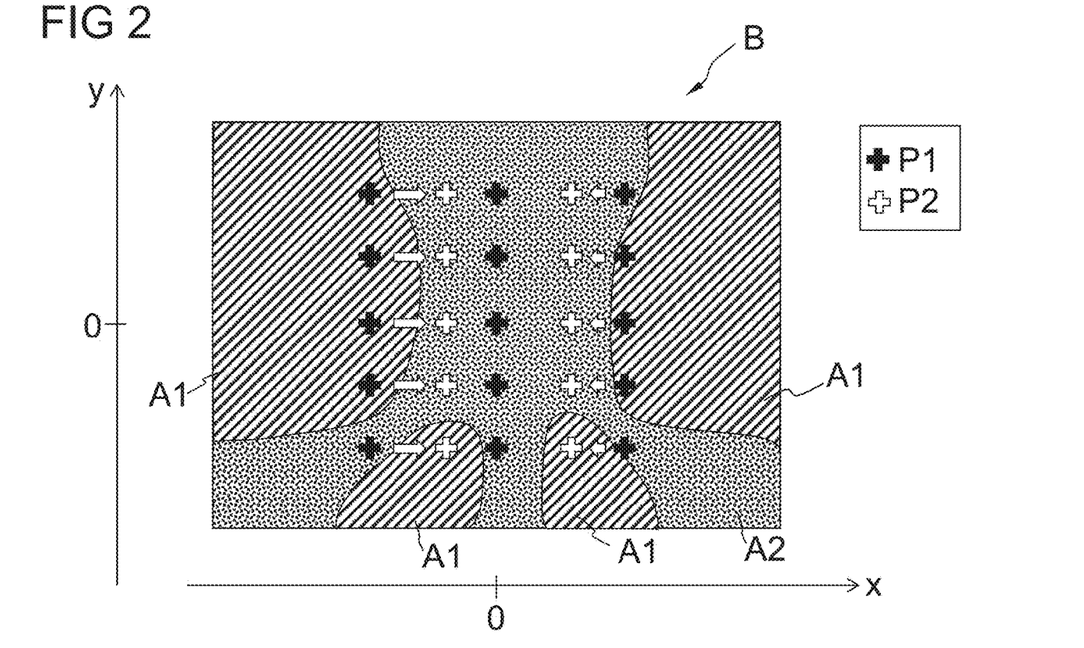
FIGS. 2-5 show exemplary distributions of test positions according to exemplary embodiments of the present disclosure.

FIG. 2 shows a first exemplary distribution of test positions in a test image B. Here first test positions P1 are positioned according to a first test grid at predetermined coordinates in the two directions (here: x-direction and y-direction) of the test image B.

Here the predetermined first test grid can uniformly cover the target volume of the test image B, at least a central region of the test image B and/or a region in which the examination object to be examined is assumed.

Of the 15 first test positions P1 shown by way of example, 7 lie in a region A1 evaluated as unfavorable by an assignment function. These test positions in a region A1 evaluated as unfavorable are blocked.

Blocked test positions, for instance the first test positions P1 located in the region A1 in FIG. 2, can however also be moved to second test positions P2. Second test positions P2 of this type are in turn assigned in accordance with the assignment function to permitted (e.g. lying in the region A2) or blocked (lying in the region A1) test positions.

For rows or columns of the first test grid, a movement of first test positions P1 to second test positions P2 can take place row by row or column by column. Movements of this type can be easily calculated. In this regard, the movement can take place here in the manner of a binary search, in order to achieve as uniform a distribution as possible, however.

A binary search of this type can be achieved for instance by the movement firstly taking place by the half distance between the grid point of a test position to be moved to the nearest grid point in the direction of the image center of the first test grid, where a check of the moved test positions is again carried out by means of the assignment function. If all or the majority of test positions P1 to be moved lie there in the favorable region A2, it is again possible now for the test positions to be moved for instance by a quarter of the half distance between the grid point of the test position to be moved to the nearest grid point in the opposite direction, wherein a check of the moved test positions is in turn carried out again by means of the assignment function. If more of the test positions P1 to be moved lie in the favorable region A2, it is again possible now for the test positions to be moved by an eighth of the half distance between the grid point of the test position to be moved to the nearest grid point back in the opposite direction. If fewer test positions than with the last check of the test positions P1 to be moved lie in the favorable region A2, it is again possible now for the test positions to be moved for instance by an eighth of the half distance between the grid point of the test position to be moved to the nearest grid point back in the original direction.

FIG. 2 shows by way of example how first test positions P1 of a column of the test grid (i.e. with an identical x coordinate), which are blocked at least partially, preferably predominantly (because they lie in the region A1), can be moved to second test positions P2 (arrows). The movement may be carried out toward the image center of the test image B (in the movement direction, here x direction) so that it is highly likely that a region A2 which is classified as favorable is achieved. In the example shown in FIG. 2, after the movement only two of the 15 test positions are still blocked (which lie here at second test positions P2 in a region A1).

In addition, or alternatively, individually blocked first test positions P1 can be moved to second test positions P2 in at least one spatial direction (x,y) of the test image B in the direction of the image center (0,0) of the test image B or to a second test position P2 with a desired intensity value in the test image B. As a result, it is possible for all blocked first test positions P1 to be moved to permitted second test positions P2. In this regard, attention can additionally be paid to as uniform a distribution of the permitted test positions P1 and P2 as possible and/or a positioning of the permitted test positions P1 and P2 in the favorable region A2 at positions with high intensity values.

Figure 3:
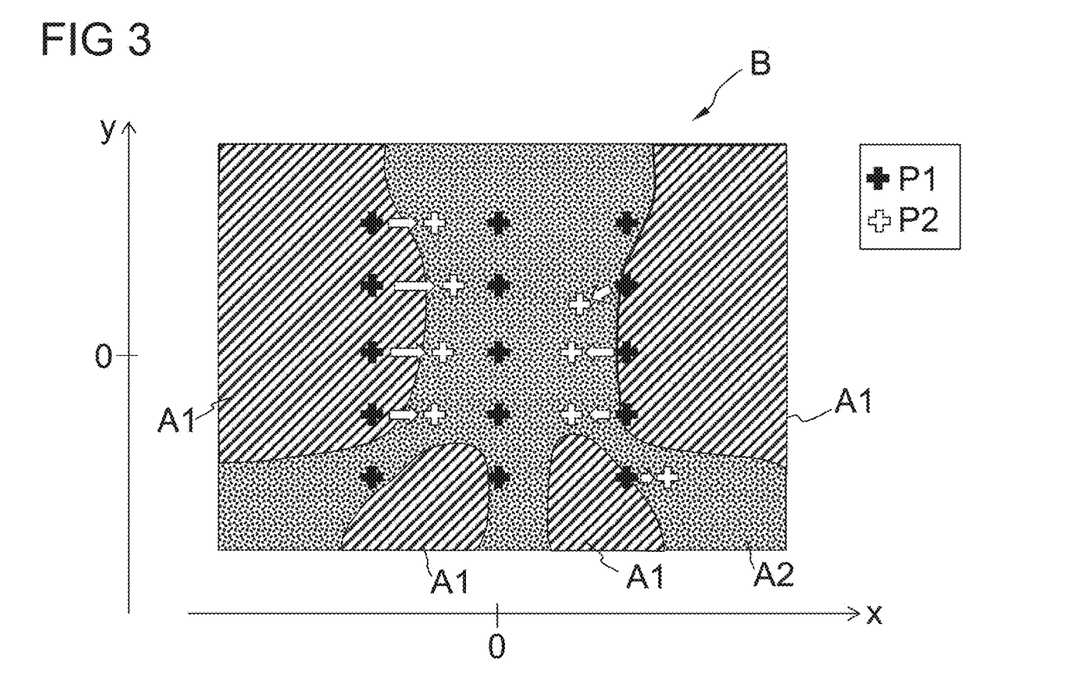

This is clarified in FIG. 3, in which based on an identical exemplary distribution of first test positions P1 according to a first test grid in a test image B as shown in FIG. 2, blocked first test positions P1 are moved individually to second test positions P2 (arrows).

Furthermore, candidate test positions P0 can be positioned according to a second predetermined test grid, which is more closely meshed than the first test grid. The candidate test positions P0 can in turn be assigned to permitted or blocked test positions in accordance with the assignment function M, and blocked first test positions can be moved for instance to spatially nearest, permitted candidate positions.

In this regard the second test grid can in turn uniformly cover the test image B. For instance, the second test grid can comprise the first test grid and have a mesh width which corresponds to half the mesh width of the first test grid.

Figure 4:
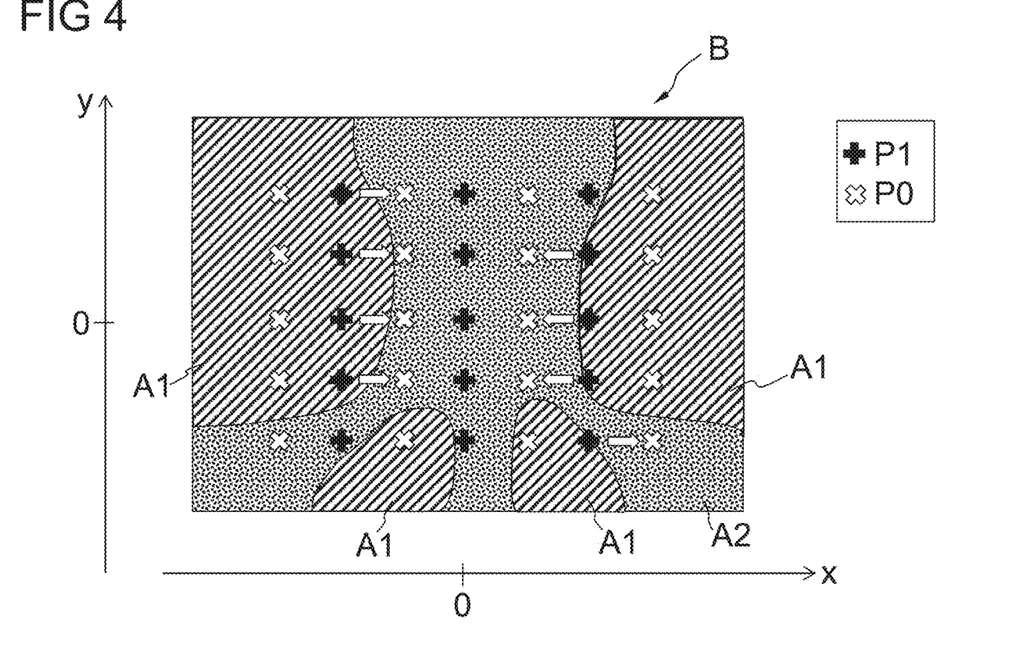

An example of this type is shown in FIG. 4, in which based on an identical exemplary distribution of first test positions P1 according to a first test grid in a test image B as shown in FIG. 2, blocked first test positions P1 are moved to the nearest permitted candidate positions P0 (lying in a region A2) of a second test grid (arrows).

It is further conceivable for the selection of test positions P1' to comprise a distribution of a predetermined number of test positions P1' in a region A2' permitted according to an approval criterion Z based on intensity values of the test image B. The approval criterion Z can define a permitted region A2', for instance by means of a segmentation of the test image B, such that the permitted region maps the examination object to be examined. In addition, or alternatively, the approval criterion Z can determine a predetermined minimal intensity value, which has to be reached in the permitted region A2.

In particular, the approval criterion Z can also be an approval function M embodied as a binary mask. A desired number of test positions P1' and/or a minimal intensity value can be fixedly predetermined or defined by a user input E.

Figure 5:
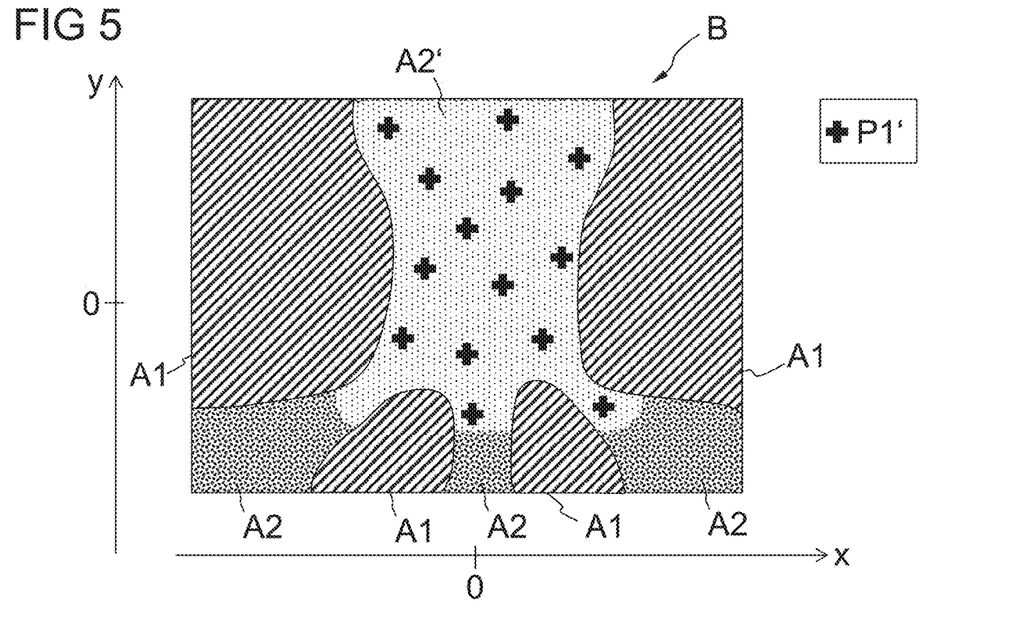

An example of this type is shown in FIG. 5, in which test positions P1' are distributed in the permitted region A2'.

In this regard, the distribution of the test positions P1' can take place for instance by means of a greedy algorithm, which the test positions carry out at grid points of a predetermined or selected (e.g. Cartesian or hexagonal) distribution grid.

The distribution grid can have a gap between its grid points which corresponds to the gap between the grid points of a test grid. The distribution grid can be a test grid.

In a modification of this embodiment, the distribution of the test positions P1' can take place by means of a dynamic greedy algorithm, which does not distribute the test positions P1' at fixed grid points of the distribution grid, but instead in circles predetermined by a selected radius about its grid points.

In addition, or alternatively, a distribution of the test positions P1' can comprise a finding of a distribution equilibrium according to an "electron-scattering" method, in which a uniform loading is attributed to test positions P1' and in accordance with electrical repulsion an optimal distribution is simulated in the permitted region A2.

Here a loading can also be attributed for instance to an edge of the permitted region A2', or a suitable edge condition can be used in order to prevent the test positions P1' from only being arranged along the edge of the permitted region A2'.

Periodic or toroidal edge conditions are considered as a boundary condition of this type, for instance, which connect the opposing edges of the permitted region A2' as almost adjoining one another so that the edges are resolved. Test measurements which deliver test results K can be carried out at inventively selected determined test positions (Block 105).

The test positions can be determined for methods for the compensation of effects of deviations of gradients actually generated during a readout duration from gradients planned for this readout duration. For instance, PSF values can be measured as test results K.

The test results can be used during the processing of further measurement data MD and/or image data BD recorded by means of the magnetic resonance system, in particular using a wave technique, as a result of which processed, in particular corrected measurement data MD* or image data BD* of a higher image quality may be obtained (Block 107).

Figure 6:
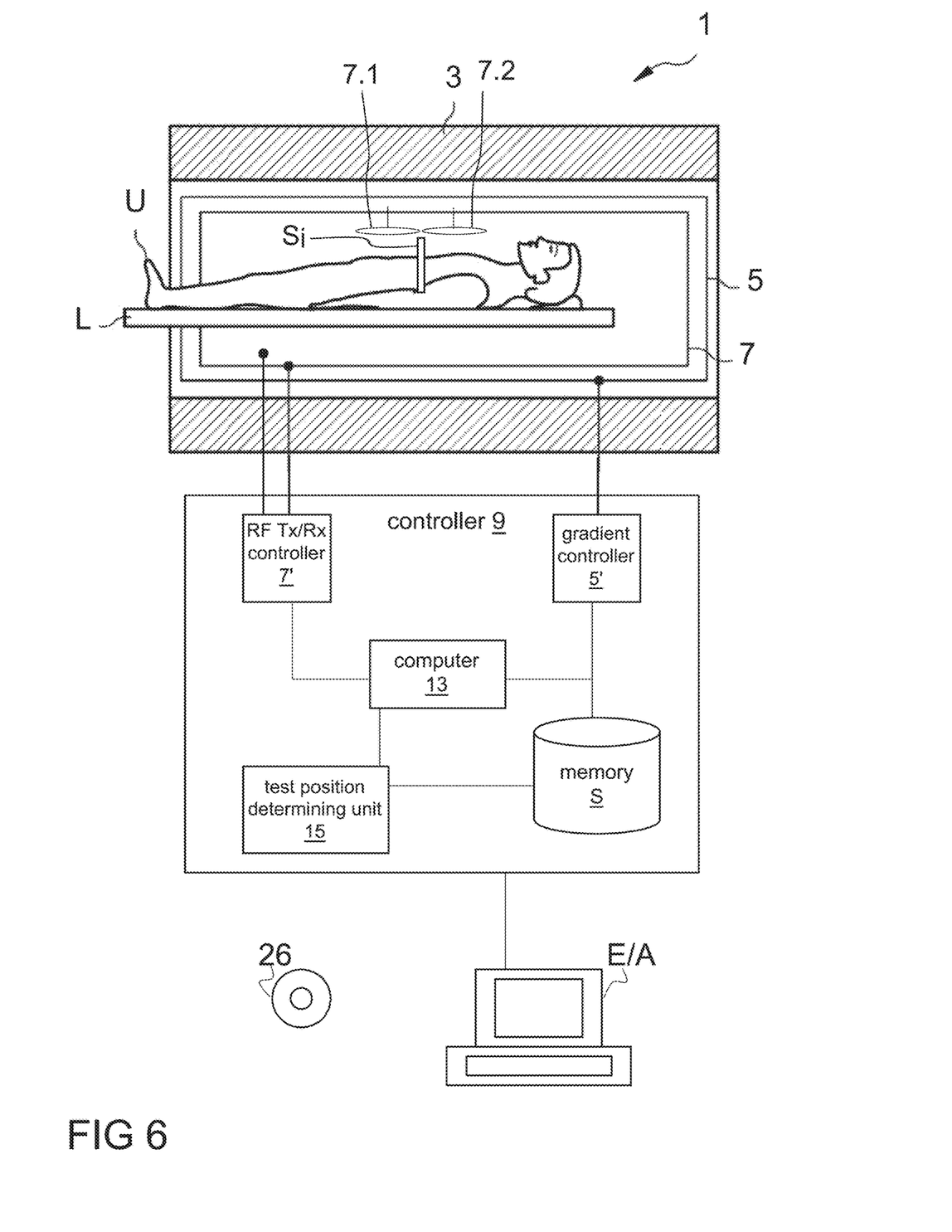
FIG. 6 shows a schematic diagram of a magnetic resonance system according to an exemplary embodiment of the present disclosure.

FIG. 6 schematically represents a magnetic resonance (MR) system 1 according to the disclosure. This system comprises a magnet unit 3 for generating the main magnetic field, a gradient unit 5 for generating the gradient fields, a radio-frequency unit 7 for radiating in and receiving radio-frequency signals and a controller 9 configured for carrying out a method according to the disclosure. The magnet unit 3, the gradient unit 5, and the radio-frequency unit 7 may collectively be referred to as a MR scanner.

In FIG. 6, these subunits of the magnetic resonance system 1 are shown only roughly schematically. In particular, the radio-frequency unit 7 can consist of a plurality of subunits, for example a plurality of coils such as the coils 7.1 and 7.2 shown schematically or more coils which can be configured either only to transmit radio-frequency signals or only to receive the triggered radio-frequency signals or for both.

In order to examine an examination object U, for example a patient or also a phantom, it can be introduced on a support L into the magnetic resonance system 1, in the measurement volume thereof. The slice or the slab Si represents an exemplary target volume of the examination object from which echo signals are to be recorded and captured as measurement data.

The controller 9 serves to control the magnetic resonance system 1 and can, in particular, control the gradient unit 5 by means of a gradient controller 5' and the radio-frequency unit 7 by means of a radio-frequency transmitting/receiving controller 7'. The radio-frequency unit 7 can herein comprise a plurality of channels on which signals can be transmitted or received.

The radio-frequency unit 7 may be responsible, together with its radio-frequency (RF) transmitting/receiving (transceiving) controller 7', for the generation and radiating-in (transmission) of a radio-frequency alternating field for manipulation of the spins in a region to be manipulated (for example in slices S to be measured) of the examination object U. Herein, the center frequency of the radio-frequency alternating field, also designated the B1 field, is typically adjusted so that, as far as possible, it lies close to the resonance frequency of the spins to be manipulated. Deviations of the center frequency from the resonance frequency are referred to as off-resonance.

In order to generate the B1 field, in the radio-frequency (RF) unit 7, currents controlled using the radio-frequency transceiver (transmitting/receiving) controller 7' are applied to the RF coils.

Furthermore, the controller 9 comprises a test position determining unit (determiner) 15 with which test positions according to the disclosure can be determined. The controller 9 may be configured overall to carry out a method according to the disclosure.

A computer unit 13 comprised by the controller 9 may be configured to carry out all the computation operations necessary for the required measurements and specifications.

Intermediate results and results required for this or determined herein can be stored in a memory storage unit (memory) S of the controller 9. The units shown are herein not necessarily to be understood as physically separate units, but represent merely a subdivision into units of purpose which, however, can also be realized, for example, in fewer, or even only in one, physical unit. In an exemplary embodiment, the controller 9 includes processing circuitry that is configured to perform one or more functions and/or operations of the controller 9. One or more of the components/units of the controller 9 may include processing circuitry that is configured to perform one or more corresponding functions and/or operations of the respective component(s).

By means of an input/output facility E/A of the magnetic resonance system 1, control commands can be passed for example by a user to the magnetic resonance system and/or results from the controller 9 such as, for example, image data can be displayed. The input/output facility E/A may be an input/output interface, such as a general-purpose computer.

A method described herein can also exist in the form of a computer program product which comprises a program and implements the described method on a controller 9 when said program is executed on the controller 9.

An electronically readable data carrier (memory storage device) 26 with electronically readable control information stored thereon can also be provided, said control information comprising at least one computer program product as described above and being configured to carry out the method described when the memory 26 is used in a controller 9 of a magnetic resonance system 1.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(y) or processor (s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for determining at least one test position for a test measurement to be recorded using a magnetic resonance (MR) system, comprising:
   recording a test image using a MR scanner of the MR-system, system;
   selecting, by a controller of the MR system, at least one test position based on the test image, wherein the selection of the at least one test position comprises:
      assigning, according to an assignment function based on intensity values of the test image at the at least one test position, the at least one test position to permitted test positions and blocked test positions; and
   making the selected at least one test position available in electronic form as a data file.

2. The method as claimed in claim 1, wherein first test positions of the at least one test position are positioned in the test image according to a predetermined first test grid.

3. The method as claimed in claim 2, wherein the predetermined first test grid uniformly covers a target volume of the test image.

4. The method as claimed in claim 2, wherein the selection of the at least one test position comprises: assigning the at least one test position to permitted test positions and blocked test positions, according to an assignment function based on intensity values of the test image at the at least one test position.

5. The method as claimed in claim 4, wherein candidate test positions are positioned according to a second predetermined test grid, which is more closely meshed than the first test grid, and assigned to permitted or blocked test positions according to the assignment function, and blocked first test positions are moved to permitted ones of the candidate test positions.

6. The method as claimed in claim 5, wherein the blocked first test positions are moved to the permitted candidate test positions that are spatially nearest to the respective blocked first test positions.

7. The method as claimed in claim 1, wherein the assignment function is configured to consider a minimal intensity value.

8. The method as claimed in claim 1, wherein the selection of the at least one test position comprises a weighting of the at least one test position according to a weighting factor based on an intensity value of the test image at a respective test position of the at least one test position, wherein a weighting with a weighting factor zero corresponds to a blockage of the respective test position.

9. The method as claimed in claim 1, wherein one or more blocked first test positions are moved to one or more respective second test positions that are assigned to permitted or blocked test positions based on the assignment function.

10. The method as claimed in claim 9, wherein, for rows or columns of the first test grid, movement of the one or more first test positions taking place row-by-row or column-by-column.

11. The method as claimed in claim 9, wherein individually blocked first test positions are moved to second test positions in at least one spatial direction of the test image in a direction of an image center of the test image or to a second test position with a desired intensity value in the test image.

12. The method as claimed in claim 1, wherein selecting the test positions comprises:
   distributing a predetermined number of test positions in a region permitted according to an approval criterion based on intensity values of the test image; and
   defining a predetermined minimal intensity value.

13. The method as claimed in claim 1, wherein the at least one test position is determined such that compensation of effects of deviations of gradients actually generated during a readout duration from gradients planned for this readout duration.

14. A computer program product, embodied on a non-transitory computer-readable storage medium, that is adapted to be loaded into a memory of a controller of a magnetic resonance system and includes a computer program, when the computer program is executed by the controller, controls the controller to perform the method as claimed in claim 1.

15. A non-transitory computer-readable storage medium having a computer program stored thereon, when executed by a processor, controls the processor to perform the method as claimed in claim 1.

16. A magnetic resonance (MR) system comprising:
a MR scanner; and
a controller is configured to:
control MR scanner to record a test image;
select at least one test position based on the test image, wherein the selection of the at least one test position comprises: assigning, according to an assignment function based on intensity values of the test image at the at least one test position, the at least one test position to permitted test positions and blocked test positions; and
output the selected at least one test position in electronic form as a data file.

17. The MR system as claimed in claim 16, wherein the MR scanner comprises a magnet unit, a gradient unit, and a radio-frequency unit.

18. The MR system as claimed in claim 16, wherein the controller comprises a radio-frequency transmitting/receiving controller and a test position determining unit.

19. A method for determining at least one test position for a test measurement to be recorded using a magnetic resonance (MR) system, comprising:
recording a test image using a MR scanner of the MR system;
selecting, by a controller of the MR system, at least one test position based on the test image; and
making the selected at least one test position available in electronic form as a data file, wherein the selection of the at least one test position comprises:
(a) a weighting of the at least one test position according to a weighting factor based on an intensity value of the test image at a respective test position of the at least one test position, a weighting with a weighting factor zero corresponding to a blockage of the respective test position; or
(b) distributing a predetermined number of test positions in a region permitted according to an approval criterion based on intensity values of the test image, and defining a predetermined minimal intensity value.

\* \* \* \* \*